United States Patent
Yoshizawa et al.

(10) Patent No.: US 6,222,315 B1
(45) Date of Patent: Apr. 24, 2001

(54) LUMINESCENT DISPLAY PANEL WITH INSULATING FILMS

(75) Inventors: Atsushi Yoshizawa; Hirofumi Kubota; Kenji Yoshida; Taizo Ishida, all of Saitama-ken (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/144,651

(22) Filed: Aug. 31, 1998

(30) Foreign Application Priority Data

Sep. 24, 1997 (JP) .................................................... 9-276523

(51) Int. Cl.$^7$ .................................................. H05B 33/22
(52) U.S. Cl. ........................................... 313/509; 313/505
(58) Field of Search ..................... 313/505, 504, 313/509, 506

(56) References Cited

U.S. PATENT DOCUMENTS 5,994,836 * 11/1999 Boer et al. ............................ 313/504
6,069,443 * 5/2000 Jones et al. ........................... 313/504

* cited by examiner

*Primary Examiner*—Michael H. Day
(74) *Attorney, Agent, or Firm*—Arent Fox Kintner Plotkin & Kahn, PLLC

(57) ABSTRACT

A luminescent display panel includes a substrate (106), a plurality of first electrodes (102) formed on the substrate (106), and a plurality of insulating films (109) formed on the substrate (106) to cover edge portions of each first electrode (102) and having the central portion thereof exposed. A luminescent layer (103) is formed on exposed portions of the first electrodes (102) and on the insulating films (109), and a plurality of second electrodes (101) are formed on the luminescent layer (103). Each of the plurality of insulating films (109) has a thickness which becomes gradually smaller toward a center line of each adjacent first electrode (102).

3 Claims, 2 Drawing Sheets

LUMINESCENT DISPLAY PANEL WITH INSULATING FILMS

BACKGROUND OF THE INVENTION

The present invention relates to a display panel, particularly to a luminescent display panel containing organic electroluminescence elements.

There have been various kinds of luminescent display panels, the best known of which is a display panel containing organic electroluminescence elements. In detail, such a display panel includes a transparent organic film on which is formed a fluorescent layer. Such a fluorescent layer will emit light if an electric current is flowing therethrough. The organic film and the fluorescent layer together form the organic electroluminescence elements used in the luminescent display panel.

FIG. 2 is a perspective view schematically illustrating a conventional luminescent display panel which includes a glass transparent substrate 6, a plurality of transparent electrodes 2 made of ITO serving as anodes, an organic layer 3 consisting of a positive hole transporting layer and a luminescent layer, a plurality of metal electrodes 1 serving as cathodes arranged in a direction orthogonal to the transparent electrodes 2. In fact, the transparent electrodes 2, the organic layer 3 and the metal electrodes 1 are successively formed on the substrate 6 by way of vapor deposition, thereby forming a multi-laminated structure In this way, with the organic layer 3 interposed between the transparent electrodes 2 and the metal electrodes 1, a plurality of luminescent sections are thus formed, with each intersection of a transparent electrode 2 and a metal electrode 1 constituting one luminescent unit serving as one picture element.

Further, since the transparent electrodes 2 have a high electrical resistance, a plurality of low resistance bus-lines 7 each consisting of a metal film are interposed between the transparent electrodes 2 and the organic layer 3 so as to compensate the transparent electrodes 2 for their electrical conductivities.

What is used to form a metal electrode 1 is an alloy having a small work function, such as Al alloy, In alloy or Ag alloy. On the other hand, what is used to form a transparent electrode 2 is an electrically conductive material having a large work function, such as ITO (having a work function of about 5.0 eV) or a gold (having a work function of about 5.1 eV). However, when a gold is used to form an electrode, the electrode will become semi-transparent. Further, the bus-lines 7 interposed between the transparent electrodes 2 and the organic layer 3 is made of Cr, Cu, Al, Mo, Ta, or their alloy, Alternatively, such a bus-line 7 may be formed of an Al—Cu—Si alloy.

FIG. 3 is a cross sectional view partially illustrating the luminescent display panel of FIG. 2. As shown in FIG. 3, between picture elements (intersections of the transparent electrodes 2 with the metal electrodes 1) are provided insulating films 9 which are then covered by the organic layer 3. In detail, the insulating films 9 are so arranged that two edge portions of each transparent electrode 2 is covered by the films 9 but the central portion thereof is exposed, resulting in a situation that the two edge portions of each insulating film 9 are suddenly climbing over the transparent electrodes 2.

In this way, by providing an insulating film 9 between every two transparent electrodes 2, it is sure to form a desired insulation between the transparent electrodes 2 and the metal electrodes 1, thereby preventing a possible mistaken light emission on areas other than desired picture elements.

Usually, a luminescent display panel shown in FIG. 3 is manufactured by forming a plurality of transparent electrodes 2 on a glass substrate 6, forming a plurality of insulating films 9 on the glass substrate 6 so as to cover the edge portions of each transparent electrode 2, followed by depositing an organic material and then a metal material to successively form the organic layer 3 and the plurality of metal electrodes 1. However, since two edge portions of each insulating film 9 are formed into vertical walls, presenting a structure which is difficult for the organic material and the metal material to deposit thereon, some areas of both the organic layer 3 and the metal electrode layer 1 will have a smaller thickness X (shown in FIG. 3) than other areas. As a result, these areas of the luminescent display panel fail to give a sufficient luminescent brightness.

Moreover, since some areas of the metal electrodes 1 have only a smaller thickness adjacent to the edge portions of the insulating films 9, it is likely that an outside moisture will invade into the organic layer 3, causing a deterioration in a light emitting quality of the display panel, and causing an increase in non-luminescent area.

SUMMARY OF THE INVENTION

It is an object of the present invention to provide an improved luminescent display panel capable of preventing an outside moisture invasion and ensuring a sufficient thickness for an organic layer and thus enabling the display panel to obtain a stabilized luminescent quality, thereby solving the above-mentioned problems peculiar to the above-mentioned prior art.

According to the present invention, there is provided a luminescent display panel, comprises a substrate, a plurality of first electrodes formed on the substrate, a plurality of insulating films formed on the substrate to cover edge portions of each first electrode but have the central portion thereof exposed, a luminescent layer formed on exposed portions of the first electrodes and on the insulating films, a plurality of second electrodes formed on the luminescent layer. The plurality of insulating films are formed in a manner such that each insulating film has a thickness which becomes gradually smaller toward a center line of each adjacent transparent electrode.

In one aspect of the present invention, each edge portion of each insulating film has an inclining angle of 45 degrees or less with respect to the surface of the substrate.

In another aspect of the present invention, the plurality of insulating films are each made of a polyimide resin.

In a further aspect of the present invention, the luminescent layer contains an organic material.

The above objects and features of the present invention will become better understood from the following description with reference to the accompanying drawings.

DETAILED DESCRIPTION OF THE PREFERRED EMBODIMENTS

Figure 1:
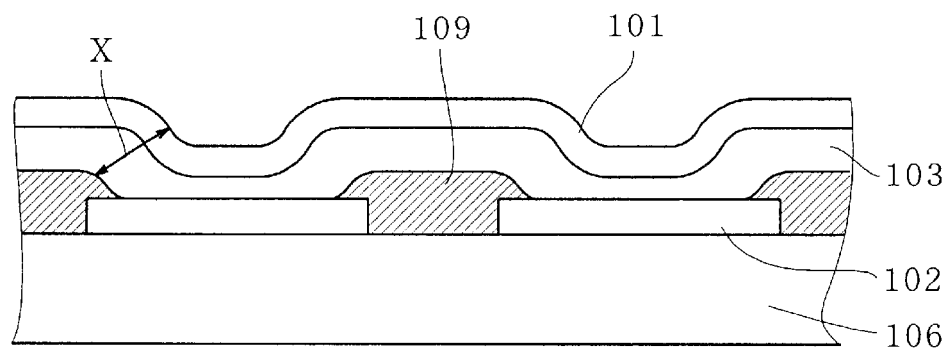
FIG. 1 is a cross sectional view partially illustrating a luminescent display panel made according to the present invention.
Figure 2:
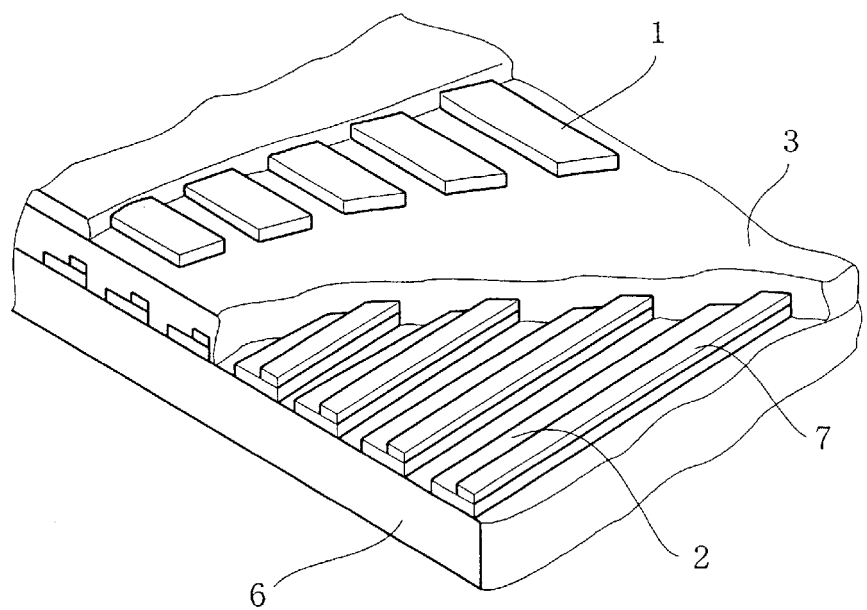
FIG. 2 is a perspective view schematically illustrating a conventional luminescent display panel.
Figure 3:
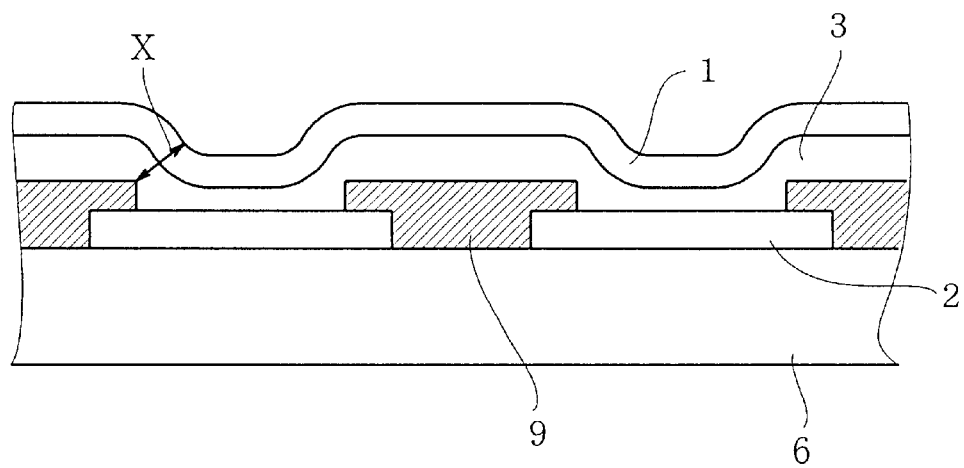
FIG. 3 is a cross sectional view partially illustrating the luminescent display panel of FIG. 2.

Referring to FIG. 1, a luminescent display panel of the present invention includes a glass transparent substrate 106, a plurality of transparent electrodes (first electrodes) 102 made of ITO serving as anodes, an organic layer 103 serving as a luminescent layer, a plurality of metal electrodes (second electrodes) 101 serving as cathodes which are arranged in a direction orthogonal to the transparent electrodes 102. In fact, the transparent electrodes 102, the organic layer 103 and the metal electrodes 101 are successively formed on the substrate 106 by way of vapor deposition, thereby forming a multi-laminated structure. In this way, with the organic layer 103 interposed between the transparent electrodes 102 and the metal electrodes 101, a plurality of luminescent sections are thus formed, with each intersection of a transparent electrode 102 and a metal electrode 101 constituting one luminescent unit serving as one picture element.

Further, since the transparent electrodes 102 have a high electrical resistance, a plurality of low resistance bus-lines 20 (not shown) each consisting of a metal film (having a lower resistance than the transparent electrode 102) are interposed between the transparent electrodes 102 and the organic layer 103 so as to compensate the transparent electrodes 102 for their electrical conductivities.

What is used to form a metal electrode 101 is a metal having a small work function, such as Al alloy, In alloy, more specifically an Al—Li alloy. On the other hand, what is used to form a transparent electrode 102 is an electrically conductive material having a large work function, such as ITO or a gold. However, when a gold is used to form an electrode, the electrode will become a semi-transparent.

Further, the bus-lines interposed between the transparent electrodes 102 and the organic layer 103 may be made of a low resistance metal, such as gold Au, platinum Pt, nickel Ni, aluminium Al, or Copper Cu. Alternatively, such bus-lines may be formed of an alloy containing two or more of the above metals.

Moreover, between picture elements (intersections of the transparent electrodes 102 with the metal electrodes 101) are provided insulating films 109 which are covered by the organic layer 103.

In detail, each insulating film 109 is formed of an electrically insulating material such as $SiO_2$ by way of sputterring. Alternatively, such an insulating film 109 may also be formed of a silicon $Si_3N_4$ film or an alumina $Al_2O_3$ film.

On the other hand, as a material for forming the insulating film 109, it is also possible to use $Y_2O_3$, $Ta_2O_5$ instead of $SiN_x$. In more detail, the insulating film 109 is formed of a photosensitive polyimide resin which has a predetermined electrically insulating property and a desired photosensitive characteristic. With the use of a method called spin coating, roller coating, printing or laminating, an insulating film layer may be formed on the glass substrate 106 with a uniform thickness. Then, by way of photolithographic process, a plurality of insulating films 109 each having a strip-like shape are thus formed.

As shown in FIG. 1, the insulating films 109 are so formed that they cover the edge portions of the transparent electrodes 102 but not the central portions thereof. Further, two edge portions of each insulating film 109 are gradually becoming thinner in its thickness toward center lines of adjacent transparent electrodes 102.

A process for the formation of the insulating film 109 will be described in detail below.

At first, a transparent electrode layer is formed on the transparent glass substrate 106 by vapor depositting ITO. Then, patterning treatment is performed on the transparent layer by way of photolithographic process, followed by etching treatment. Therefore, a plurality of transparent electrodes 102 each having a strip-like shape are thus formed.

Afterwards, the substrate formed with the plurality of transparent electrodes 102 are completely coated with a polyimide PIX through a method called spin coating, thereby obtaining a spin coated laminated substrate. The spin coated laminated substrate is then baked in an oven under a temperature of 160° C. to remove a solvent by virtue of evaporation, thus forming an insulating film of polyimide.

Subsequently, the surface of the polyimide insulating film is coated with a photoresist by means of spin coating, followed by solidification through baking treatment under a temperature of 100° C.

Then, exposure treatment is performed on the photoresist layer by way of light irradiation, so as to remove the photoresist on the central portion of each transparent electrode 102. In this way, the polyimide resin on the central portion of each transparent electrode 102 is exposed, and the photoresist remaining on the positions corresponding to edge portions of each transparent electrode 102 is remained. After that, a developing treatment is performed so that the exposed polyimide resin may be dissolved into the developing solution, thereby obtaining a plurality of insulating films 109 in a predetermined pattern. Further, by adjusting a developing time for developing treatment, it is possible to control the thickness of the edge portions of each insulating film 109. In practice, by setting a relatively short time for developing treatment, it is sure to form a gentle slop on each edge portion of each insulating film 109.

After obtaining a plurality of insulating films 109 each having a gentle slop on either edge portion thereof, a butyl acetate solution is used to wet the remaining photoresist on the center portion of each transparent electrode 102 so as to remove the same, followed by washing with an isopropylene alcohol.

The laminated substrate, after being treated in the above manner, is then baked in a clean oven under a temperature of 360° C., thereby obtaining a plurality of desired insulating films 109.

Subsequently, cathode partitions, an organic layer, and metal electrodes, are successively formed on the previously laminated substrate, thereby forming organic electroluminescence elements. Finally, after forming a protection layer as an outmost layer, a desired luminescent display panel is thus obtained.

Then, the display panel is sealed up and a test is conducted to investigate the performance of the luminescent areas corresponding to the edge portions of picture elements. It was found that there were no any non-luminescent areas when each edge portion of an insulating film 109 has an inclining angle of 30, 40 or 45 degrees. On the other hand, when each edge portion of an insulating film 109 has an inclining angle of 50 degrees, non-luminescent areas were found on the edge portions of the picture element.

As can be understood from the above description, with the use of the present invention, it is possible to obtain the following effects.

Firstly, since each edge portion of each insulating film 109 has an inclining angle of 45 degrees or less, some areas (corresponding to the edge portions of the insulating films 109) of both the organic layer 103 and the metal electrode layer 101, have the same thickness X (shown in FIG. 1) as other areas. Thus, these areas of the luminescent display panel will be sure to give a sufficient luminescent brightness.

Secondly, since each edge portion of each insulating film 109 presents a gentle slop having an inclining angle of 45 degrees or less, a protection layer (not shown) may be laminated in a more flat position as an outmost layer, thereby effectively preventing an invasion of outside moisture into the display panel, and thus preventing a possible deterioration in luminescent quality.

While the presently preferred embodiments of the this invention have been shown and described above, it is to be understood that these disclosures are for the purpose of illustration and that various changes and modifications may be made without departing from the scope of the invention as set forth in the appended claims.

What is claimed is:

1. A luminescent display panel, comprising:

a substrate;

a plurality of first electrodes formed on the substrate;

a plurality of insulating films formed on the substrate to cover edge portions of each first electrode but have the central portion thereof exposed;

a luminescent layer formed on exposed portions of the first electrodes and on the insulating films;

wherein the plurality of insulating films are formed in a manner such that each insulating film has a thickness which becomes gradually smaller toward a center line of each adjacent first electrode;

wherein each edge portion of each insulating film has an inclining angle of 45 degrees or less with respect to the surface of the substrate.

2. The luminescent display panel according to claim 1, wherein the plurality of insulating films are each made of a polyimide resin.

3. The luminescent display panel according to any one of claims 1 or 2, wherein the luminescent layer contains an organic material.

* * * * *